US008889018B2

(12) United States Patent
Mao et al.

(10) Patent No.: US 8,889,018 B2
(45) Date of Patent: Nov. 18, 2014

(54) METHOD FOR MANUFACTURING A MAGNETIC WRITE POLE USING A MULTI-LAYERED HARD MASK STRUCTURE

(75) Inventors: Guomin Mao, San Jose, CA (US); Yi Zheng, San Ramon, CA (US)

(73) Assignee: HGST Netherlands B.V., Amsterdam (NL)

(*) Notice: Subject to any disclaimer, the term of this patent is extended or adjusted under 35 U.S.C. 154(b) by 310 days.

(21) Appl. No.: 12/953,269

(22) Filed: Nov. 23, 2010

(65) Prior Publication Data

US 2012/0125883 A1 May 24, 2012

(51) Int. Cl.
*B44C 1/22* (2006.01)
*G11B 5/31* (2006.01)
*H05K 3/02* (2006.01)
*H05K 3/00* (2006.01)

(52) U.S. Cl.
CPC .............. *H05K 3/027* (2013.01); *H05K 3/0073* (2013.01); *G11B 5/3116* (2013.01); *G11B 5/3163* (2013.01); *H05K 2203/092* (2013.01)
USPC ................................. 216/22; 216/41; 216/79

(58) Field of Classification Search
CPC . G11B 5/3116; H05K 3/027; H05K 2203/092
USPC .................. 216/22, 41, 79; 438/692
See application file for complete search history.

(56) References Cited

U.S. PATENT DOCUMENTS

| | | | |
|---|---|---|---|
| 6,174,818 B1 | 1/2001 | Tao et al. | |
| 6,245,669 B1 | 6/2001 | Fu et al. | |
| 7,078,351 B2 | 7/2006 | Chiu et al. | |
| 7,163,879 B2 | 1/2007 | Tamura | |
| 7,441,325 B2 | 10/2008 | Gao et al. | |
| 7,469,467 B2 | 12/2008 | Gao et al. | |
| 7,509,729 B2 | 3/2009 | Allen et al. | |
| 7,562,437 B2 | 7/2009 | Pentek et al. | |
| 7,563,381 B2 | 7/2009 | Baer et al. | |
| 7,587,810 B2 | 9/2009 | Le | |
| 7,712,207 B2 | 5/2010 | Pentek et al. | |
| 2001/0045646 A1 | 11/2001 | Shields et al. | |
| 2003/0157803 A1* | 8/2003 | Pinarbasi et al. | 438/692 |
| 2008/0118866 A1* | 5/2008 | Breyta et al. | 430/271.1 |
| 2008/0206690 A1 | 8/2008 | Kennedy et al. | |

(Continued)

OTHER PUBLICATIONS

Kim et al., "Optimization of Hardmask for Dual Anti-Reflection Layers," Proc. of SPIE, vol. 6519, 2007, p. 1-6.

(Continued)

*Primary Examiner* — Duy Deo
*Assistant Examiner* — Mahmoud Dahimene
(74) *Attorney, Agent, or Firm* — Zilka-Kotab, PC

(57) ABSTRACT

A method for manufacturing a magnetic write pole using a mask that includes a multi-layer hard mask. The multi-layer hard mask hard mask includes a first hard mask layer that is constructed of a Si containing material that can be spun on and a second hard mask material that is deposited by a deposition process such as sputter deposition. The first hard mask layer has optical properties that allow it to function well as a bottom anti-reflective coating (BARC) and also has optical properties that match well with an underlying image transfer layer. The second hard mask material has good selectivity for reactive ion etching so that it functions well as a RIE hard mask.

11 Claims, 15 Drawing Sheets

(56) References Cited

U.S. PATENT DOCUMENTS

2008/0232001 A1 9/2008 Bonhote et al.
2010/0092895 A1 4/2010 Zhang et al.
2010/0128392 A1 5/2010 Bonhote et al.
2010/0176087 A1* 7/2010 Igarashi et al. .................. 216/79

OTHER PUBLICATIONS

Choi, Sang-Jun, "Novel spin-on hard mask with Si containing bottom antireflective coating for nanolithography," American Vacuum Society, J. Vac. Sci. Technol. B 25(3), May/Jun. 2007, p. 868-872.

Cho et al., "Materials for Nano Patterning in Semiconductor Fabrication; Organosilicon and High Carbon-Containing Materials for Spin Coating Hardmask," Polymer Science and Technology, vol. 20, No. 5, Oct. 2009, p. 472-480.

Kim et al., "Silicon-Based Anti-Reflective Spin-on Hardmask Materials with Improved Storage Stability for 193 nm Lithography," Proc. of SPIE, vol. 6519, 2007, p. 1-10.

Guerrero et al., "Resist double patterning on BARCs and spin-on multilayer materials," Proc. of SPIE, vol. 7520, 2009, p. 1-7.

* cited by examiner

METHOD FOR MANUFACTURING A MAGNETIC WRITE POLE USING A MULTI-LAYERED HARD MASK STRUCTURE

FIELD OF THE INVENTION

The present invention relates to perpendicular magnetic write heads and more particularly to a method for defining a narrow track width magnetic write pole of a magnetic write head.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head can include a magnetic write pole and a magnetic return pole, the write pole having a much smaller cross section at the ABS than the return pole. The magnetic write pole and return pole are magnetically connected with one another at a region removed from the ABS. An electrically conductive write coil induces a magnetic flux through the write coil. This results in a magnetic write field being emitted toward the adjacent magnetic medium, the write field being substantially perpendicular to the surface of the medium (although it can be canted somewhat, such as by a trailing shield located near the write pole). The magnetic write field locally magnetizes the medium and then travels through the medium and returns to the write head at the location of the return pole where it is sufficiently spread out and weak that it does not erase previously recorded bits of data.

In order to increase data density, the size of the track width of the write pole must be reduced. Therefore, there remains an ever present need to find ways to further reduce the track width of a write pole in a magnetic write head.

SUMMARY OF THE INVENTION

The present invention provides a method for patterning a metallic material using a mask that includes a multi-layer hard mask. The multi-layer hard mask includes a first hard mask layer that is constructed of a Si containing material that can be spun on and a second hard mask material that is deposited by a deposition process such as sputter deposition.

The first hard mask layer has optical properties that allow it to function well as a bottom anti-reflective coating (BARC) and also has optical properties that match well with an underlying image transfer layer. The second hard mask material has good selectivity for reactive ion etching so that it functions well as a RIE hard mask. The resulting process allows a well defined write pole to be formed at very narrow track width with tight CD control.

The method can be especially useful in the patterning of a magnetic material such as a magnetic write pole material to form a magnetic write pole for use in a magnetic data recording system.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
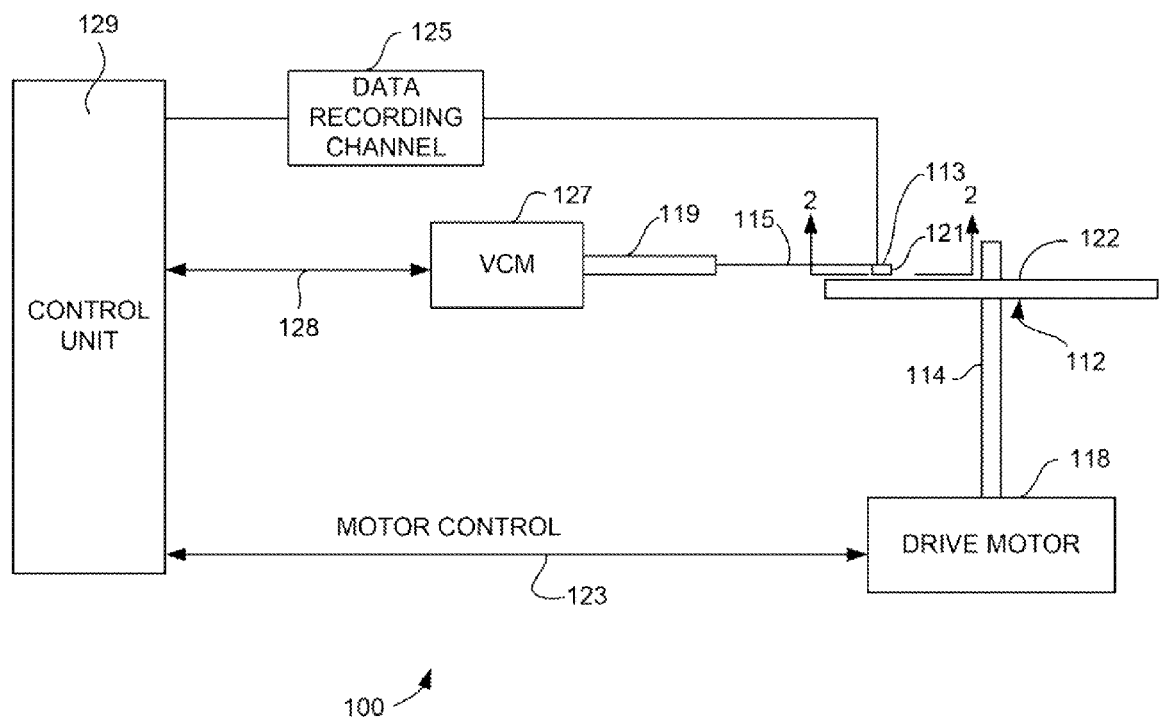
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
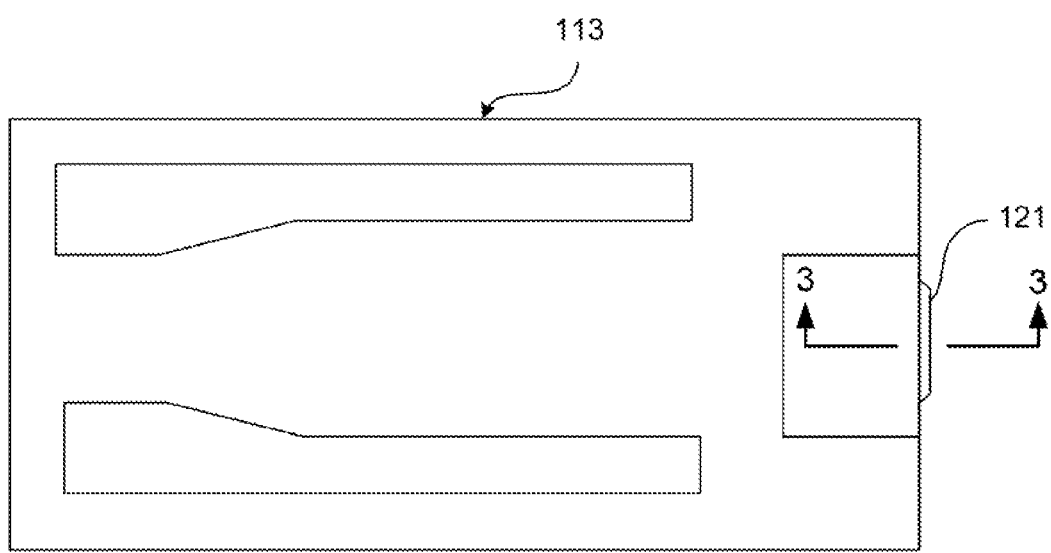
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
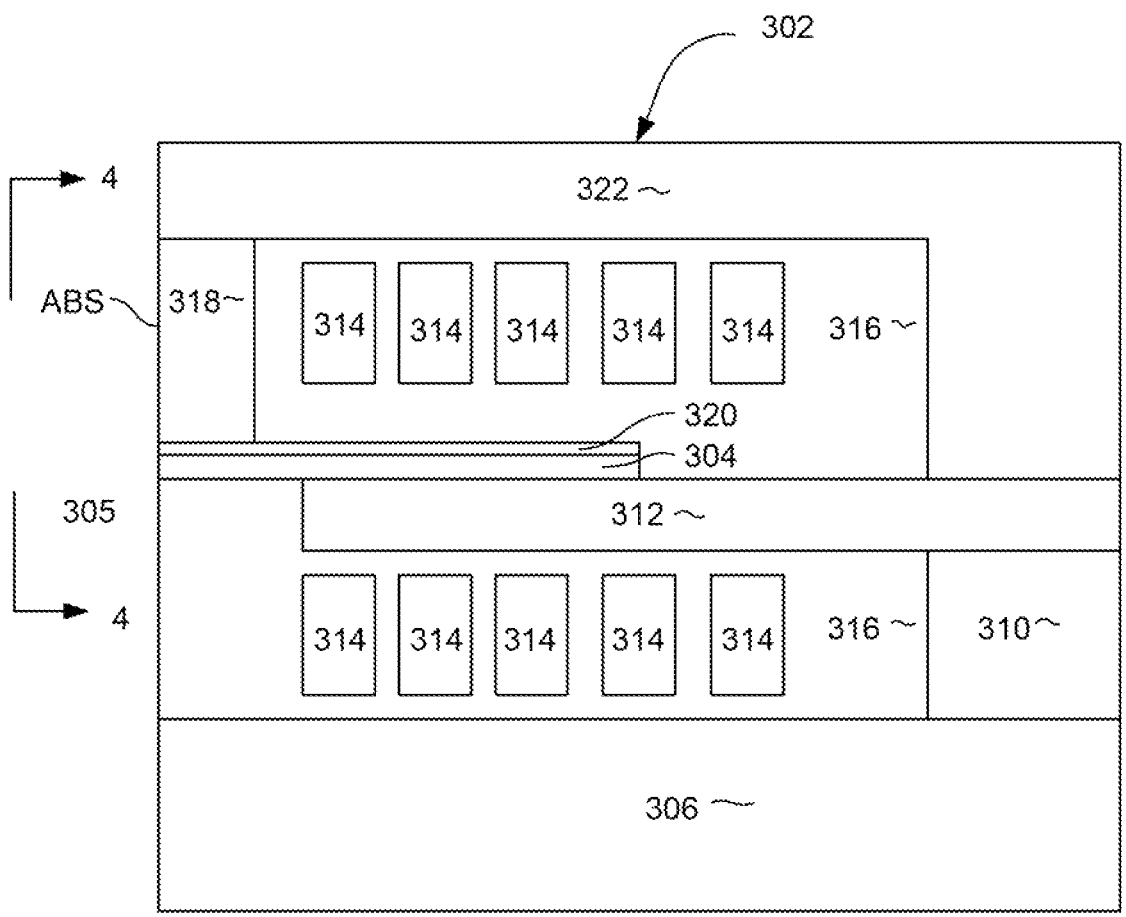
FIG. 3 is a cross sectional view of a magnetic head, taken from line 3-3 of FIG. 2 and rotated 90 degrees counterclockwise, of a magnetic head according to an embodiment of the present invention.

With reference now to FIG. 3, the invention can be embodied in a magnetic head 302, which is formed upon the trailing edge of the slider 113 (FIG. 2). The write head 302 includes a magnetic write pole 304 and a magnetic return pole 306. The return pole 306 has a cross section at the air bearing surface (ABS) that is much greater than the cross section of the write pole 304 at the ABS. The write pole 304 and return pole 306 are connected with one another in a region removed from the ABS by a magnetic back gap layer 310, and by a magnetic shaping layer 312 that connects the back gap 310 with the write pole 304 and channels magnetic flux to the smaller write pole 304. The return pole 306, back gap 310 and shaping layer 312 can each be constructed of a magnetic material such as CoFe. The write pole 304 can be a lamination of magnetic layers such as CoFe separated by thin layers of non-magnetic material. This laminated write pole structure is formed by a process described below, and is helpful in reducing eddy currents in the write pole and increasing magnetic switching within the write pole 304.

A non-magnetic, electrically conductive write coil 314, shown in cross section in FIG. 3, passes between the write pole 304 and the return pole 306, and preferably also passes above the write pole 304. The write coil can be embedded in a non-magnetic, electrically insulating layer 316 such as one or more layers of alumina and or hard baked photoresist.

When a current flows through the write coil 314, the resulting magnetic field causes a magnetic flux to flow through the return pole 306, back gap layer 310 shaping layer 312 and write pole 304. That results in a magnetic write field being emitted from the tip of the write pole 304 at the ABS. Because the write pole 304 has a small cross section at the ABS, the write field is dense and strong and can write a magnetic bit to a magnetic medium passing by the ABS of the write head 302. This magnetic write field passes through the magnetic medium before returning to the return pole 306. Because the return pole 306 has a much larger cross section at the ABS, the magnetic field returning to the return pole 306 is sufficiently spread out and weak that it does not erase the previously recorded bit.

In order to increase the field gradient of the magnetic field emitted from the write pole, and thereby increase the write speed, a magnetic trailing shield 318 is formed adjacent to the trailing edge of the write pole 304. The trailing magnetic shield 318 can be magnetically connected with the rest of the magnetic structure at the back of the write head 302 by a trailing return pole structure 322. The trailing magnetic shield 318 is separated from the write pole 304 by a non-magnetic trailing gap layer 320.

Figure 4:
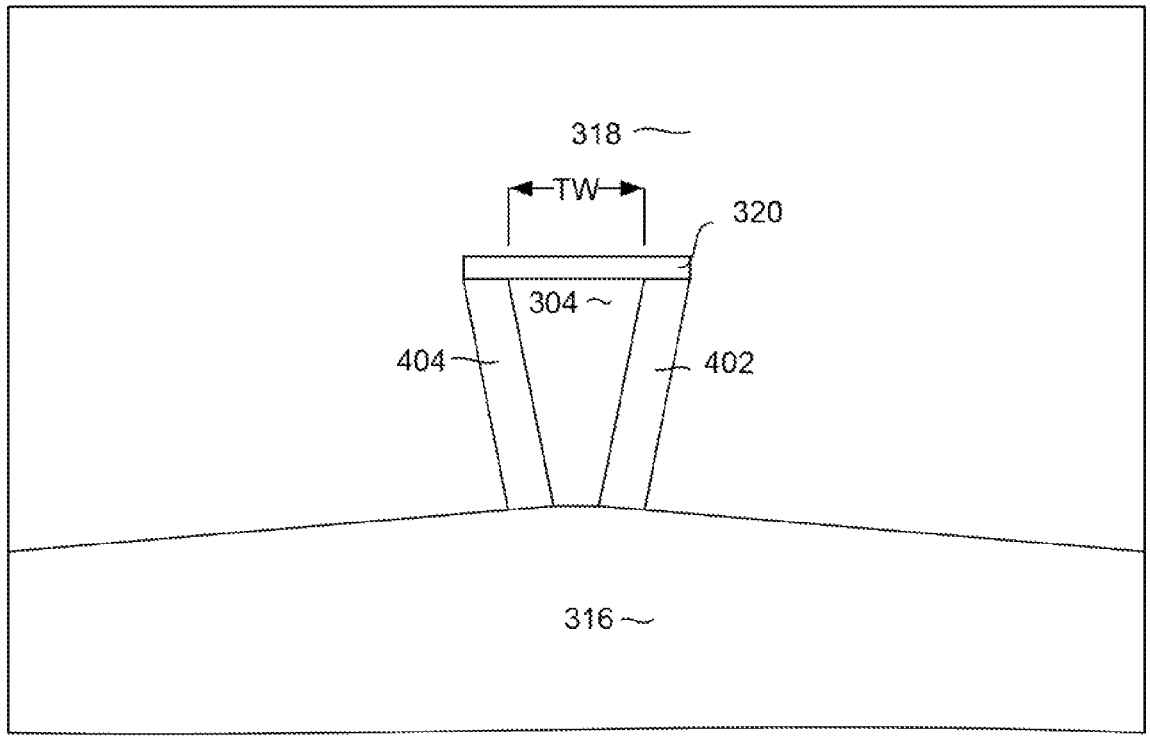
FIG. 4, is an ABS view of a portion of the write head of FIG. 3, shown enlarged as seen from line 4-4 of FIG. 3.

With reference now to FIG. 4, the write pole 304 can be seen as viewed from the air bearing surface (ABS), as viewed from line 4-4 of FIG. 3. As can be seen, the write pole has a trapezoidal shape. This is the result of a manufacturing process that will be described below and helps to avoid skew related adjacent track interference. Also, as can be seen in FIG. 4, the trailing shield 318 can wrap around the sides of the write pole 304 to provide side shielding. The side portions of the shield 318 are separated from the write pole 304 by first and second non-magnetic side gap layers. The width of the write pole 304 defines a track width (TW) of the write head 302. Reducing the track width is necessary to increase the data density of the magnetic data recording system. However, in reducing the track width (TW), accurate definition of the write pole surfaces must be maintained.

Figure 5:
FIGS. 5-12, are views of a write head in various intermediate stages of manufacture illustrating a method for manufacturing a write head according to an alternate embodiment of the invention.

FIGS. 5-12 illustrate a method for manufacturing a magnetic write pole 304 with a very narrow, well defined track width (TW). With particular reference to FIG. 5, a substrate 502 is formed with a planar upper surface. The substrate 502 can include the fill layer 316 and at least a portion of the magnetic shaping layer 312 both or which were described above with reference to FIG. 3. A magnetic write pole material 304 is deposited over the substrate. The magnetic write pole material preferably includes layers of magnetic material such as CoFe separated from one another by thin layers of non-magnetic material, both of which can be deposited by a process such as sputter deposition. An image transfer layer 504 is then deposited over the magnetic write pole material 304. The image transfer layer 504 can be a soluble polyimide material such as DURIMIDE®, which has resistance to ion milling and can be removed after ion milling. The image transfer layer 504 can be deposited to a thickness of about 1 micrometer.

Figure 6:
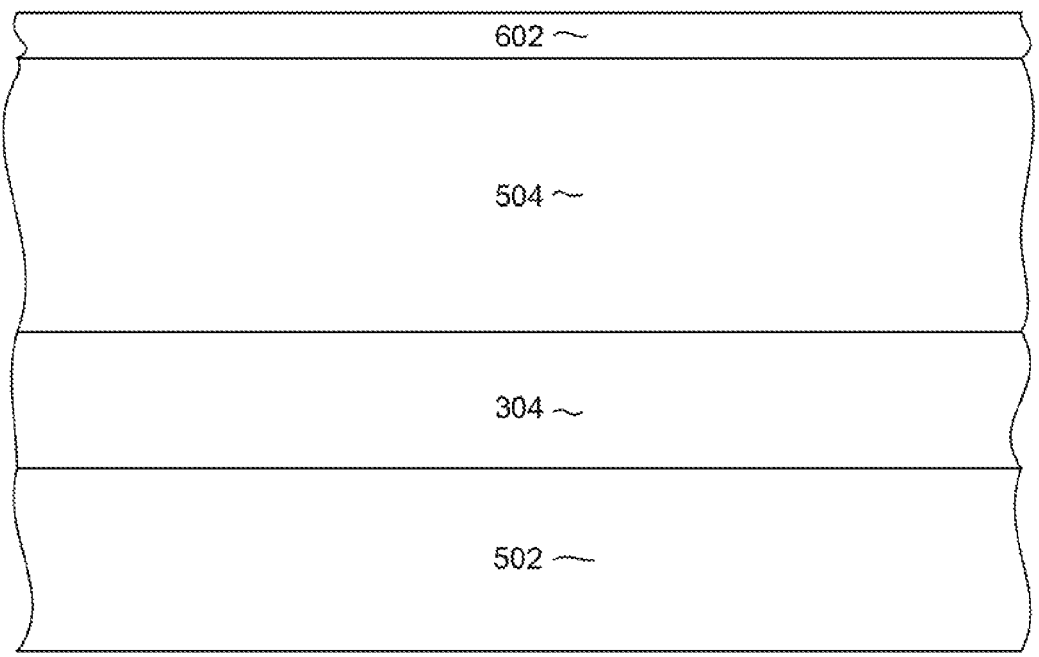

Then, with reference to FIG. 6, a first hard mask layer 602 is deposited by spinning on a material such as a Si containing hard mask material material. An example of a Si containing hard mask material that can be spun on is SIHM® produced by Shinetsu Microsi®. Another example of a Si containing hard mask material that can be spun on is UVAS® produced by Honeywell®. This first hard mask material is designed to have excellent optical properties and functions as a bottom anti-reflective coating (BARC) as will be discussed in greater detail herein below. This first hard mask layer 602 is preferably deposited to a thickness of 20-300 nm or about 30 nm.

Figure 7:
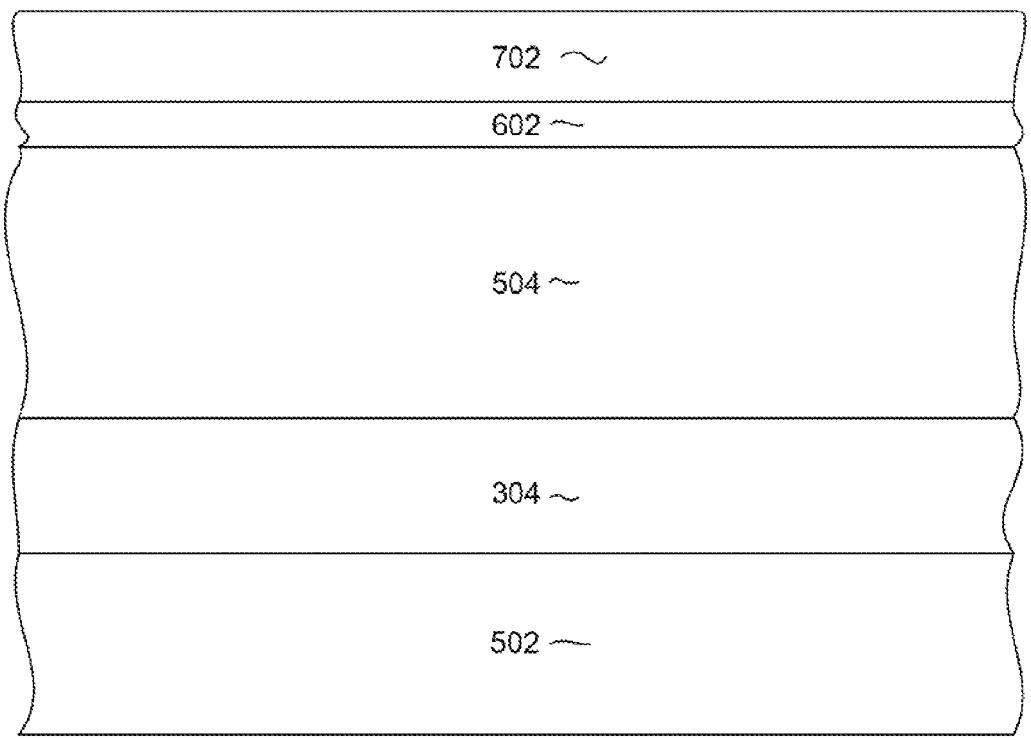

With reference to FIG. 7, a second hard mask layer 702 is deposited over the first hard mask 602. The second hard mask is a material that has good RIE selectivity, making it a good hard mask material for image transfer. The second hard mask is preferably constructed of $SiO_2$ which has been deposited by a process such as sputter deposition. Other suitable materials for the second hard mask layer 702 include $SiO_xN_y$, SiN, TaO or $Ta_2O_5$. This second hard mask layer 702 is preferably deposited to a thickness of 2 to 300 nm or about 125 nm.

Figure 8:
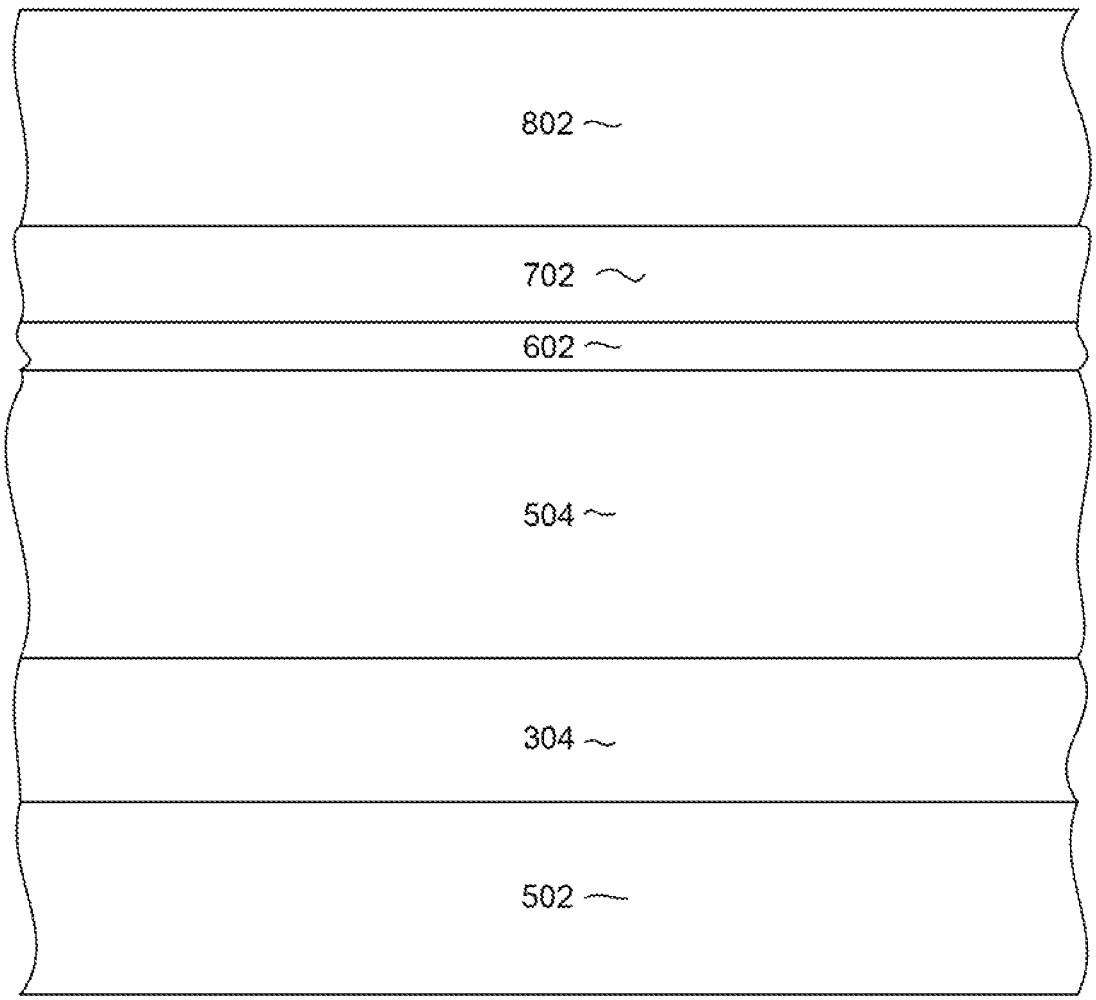
Figure 9:
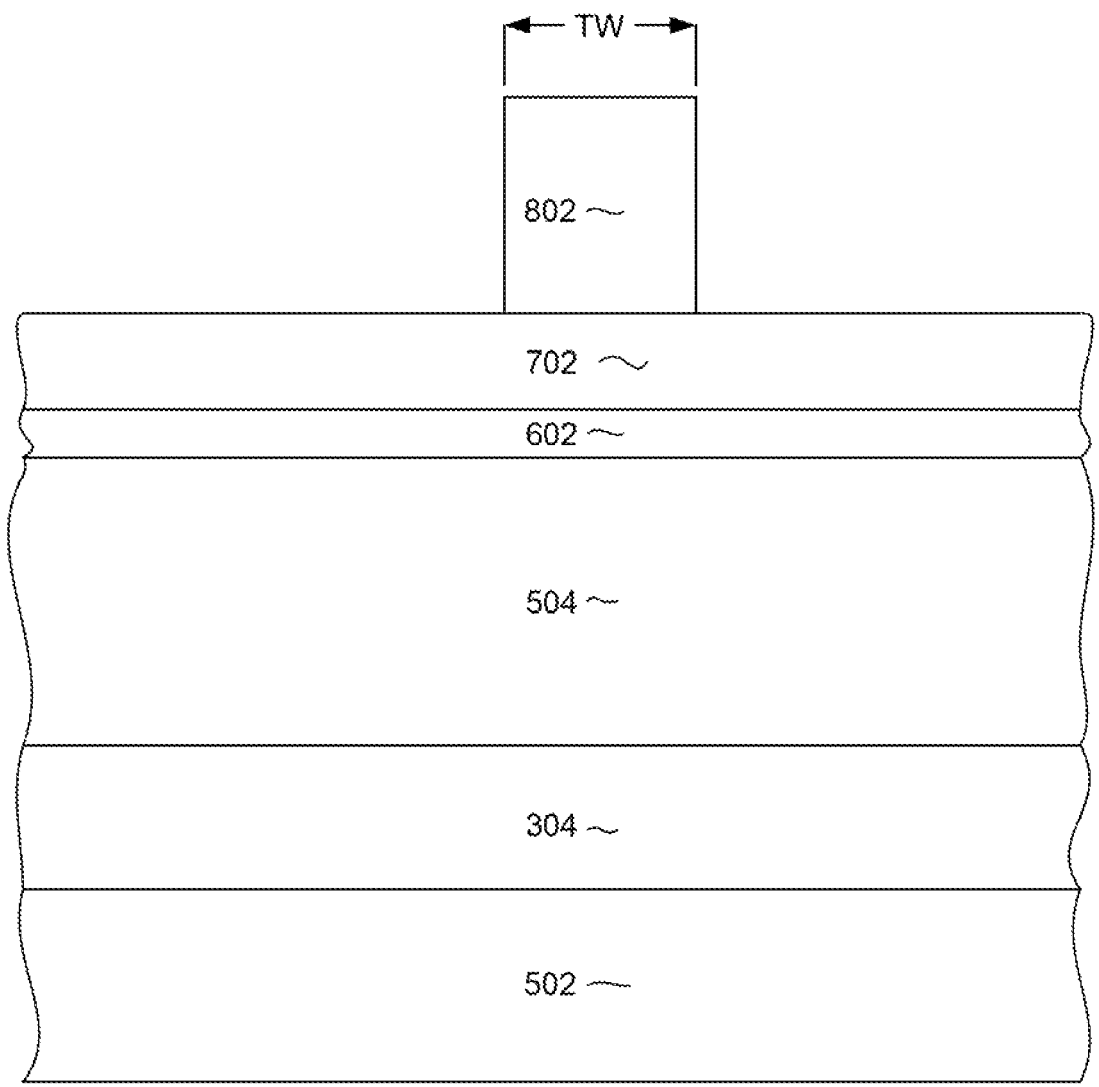

Then, with reference to FIG. 8, a layer of photosensitive material such as photoresist 802 is deposited over the second hard mask layer. The photoresist material can be a material such as UV-110® manufactured by Shirpley®, and is preferably deposited to a thickness of 200 500 nm or about 350 nm. The photoresist material 802 is then photolithotraphically patterned to define a mask structure as shown in FIG. 9, having a width that is configured to define a track-width (TW) of the yet to be formed write head.

Figure 10:
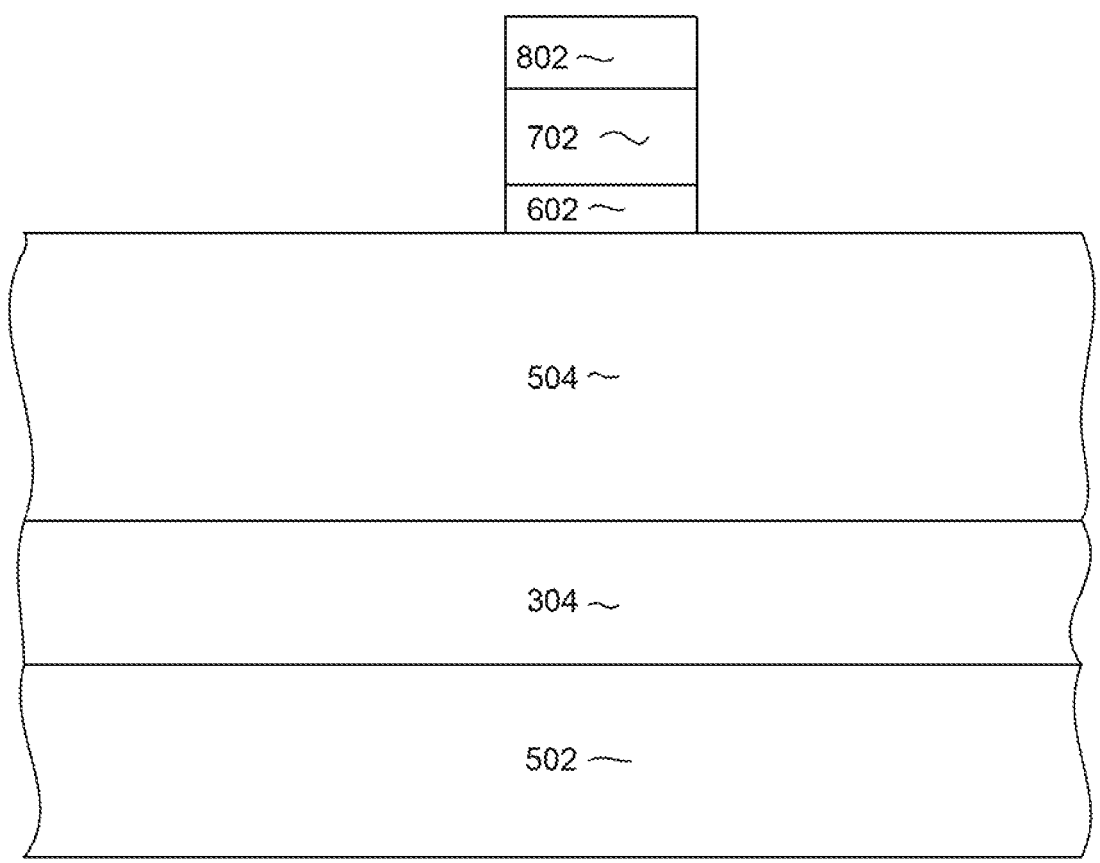

A first reactive ion etching (RIE) is then performed to transfer the image of the photoresist mask 802 onto the underlying first and second hard mask layers 602, 702, leaving a structure as shown in FIG. 10. This RIE is preferably performed in a fluorine chemistry in order to have good etch selectivity for removing the first and second hard mask layers. This first RIE removes a portion of the photoresist layer 802, as shown in FIG. 10.

Figure 11:
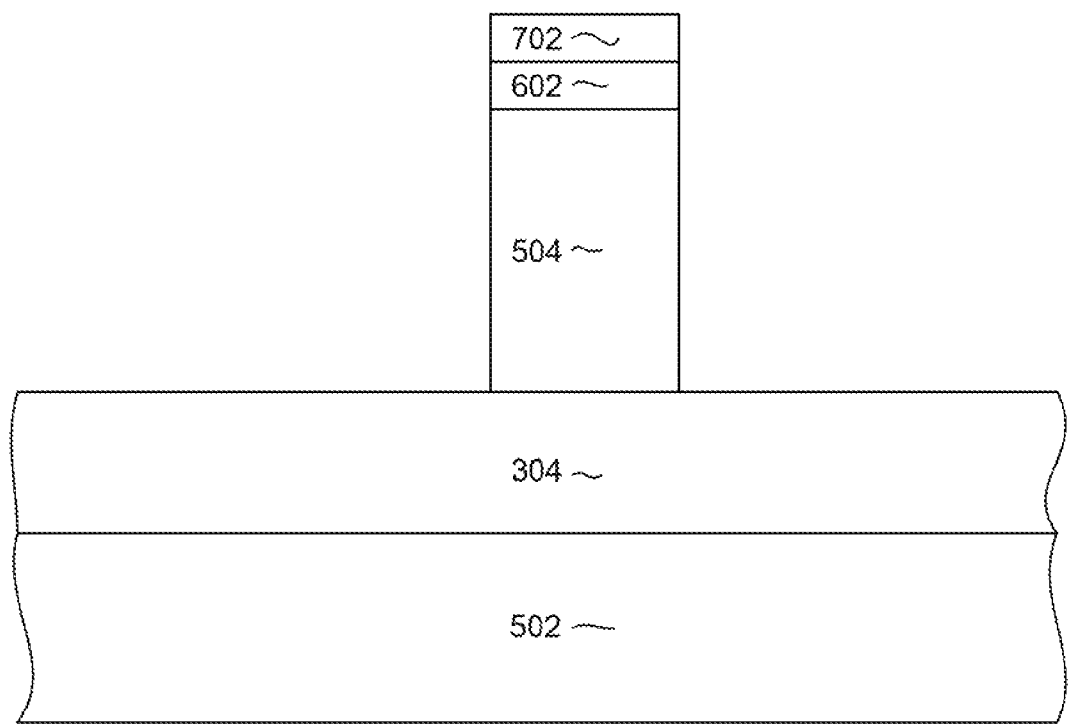

Then, a second reactive ion etching (RIE) is performed to transfer the image of the hard mask layers 602, 702 onto the underlying image transfer layer 504 by removing portions of the image transfer layer 504 that are not protected by the hard mask layers 602, 702, thereby leaving a structure such as shown in FIG. 11. This second RIE is preferably performed in an oxygen ($O_2$) chemistry, which has good selectivity for removing the image transfer layer 504 at a much faster rate than the hard mask layers 602, 702. The second RIE removes a portion of the layer 702 as shown in FIG. 11.

Figure 12:
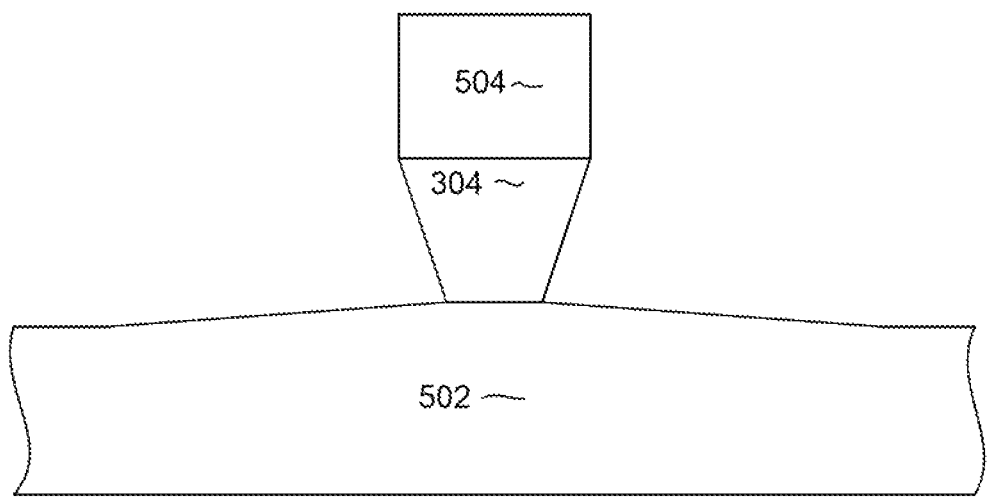

Then, with reference to FIG. 12 an ion milling is performed to transfer the image of the mask layers 504, 602, 702 onto the underlying magnetic write pole material 304 by removing portions of the write pole material 304 that are not protected by the mask layers 504, 602, 702. The ion milling is preferably performed at one or more angles relative to normal to form the write pole material 304 with tapered sides, thereby forming the write pole 304 with a trapezoidal shape as shown in FIG. 12. This ion milling process may, and probably does, remove all or most of the hard mask layers 602, 702 as well as a portion of the image transfer layer 504.

After the write pole 304 has been formed by this method other processes (not shown) can be performed to construct the trailing shield 318, side gaps 402, 404 and trailing gap 320 previously described with reference to FIGS. 3 and 4. Such processes can also be used to remove any remaining image transfer layer 504 from atop the write pole 304.

The use of a bi-layer hard mask structure that includes the spun on first hard mask 602 and sputter deposited second hard mask 702 provides significant advantages over the use of only a single hard mask of either type alone. The first hard mask layer 602 has excellent optical properties, and these optical properties are well matched to the under-lying image transfer layer 504. This material also makes an excellent bottom anti-reflective coating (BARC), which greatly improves photo-lithographic resolution during patterning of the photoresist mask 802. However, such a spun on mask layer 602 does not have as good selectivity for patterning by reactive ion etching as does a harder mask layer such as those used in the second hard mask 702.

The second hard mask 702, which as described above can be $SiO_2$, $SiO_xN_y$, SiN, TaO or $Ta_2O_5$ provides excellent RIE selectivity which facilitates patterning of the hard mask layer and leads to excellent control of critical dimensions such as track width. However, this second hard mask material does not provide optical properties for use as a bottom anti-reflective coating layer (BARC) and its optical properties do not match well with the image transfer layer 504.

Use of this bi-layer hard mask structure 602, 702 takes advantage of the best properties of both materials to construct a mask structure that ensures high resolution and excellent critical dimension control. The majority of the bi-layer structure 602, 702 is the harder second hard mask layer 702, with a thin first hard mask layer 602 underneath to provide the optical properties needed for resolution.

Another advantage of the bi-layer hard mask 602-702 is to prevent contamination of the first hard mask layer 602 from the photoresist layer 802. Spun on hard mask materials that function as BARC layers are susceptible to contamination by photoresist materials or contamination from environmental poisoning materials like amine during delay between the spun on hard mask 602 application and resist 802 application. The second hard mask layer 702 is, however, resistant to such contamination and acts as a capping layer to prevent such contamination of the first hard mask layer 602.

Figure 13:
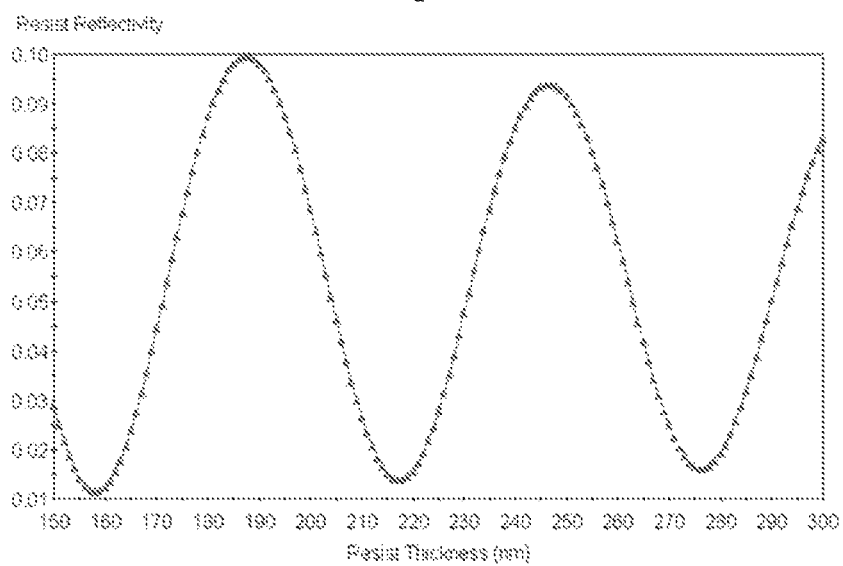
FIG. 13 is a graph illustrating reflectivity swing using a mask structure having only a sputter deposited hard mask layer such as $SiO_2$.
Figure 14:
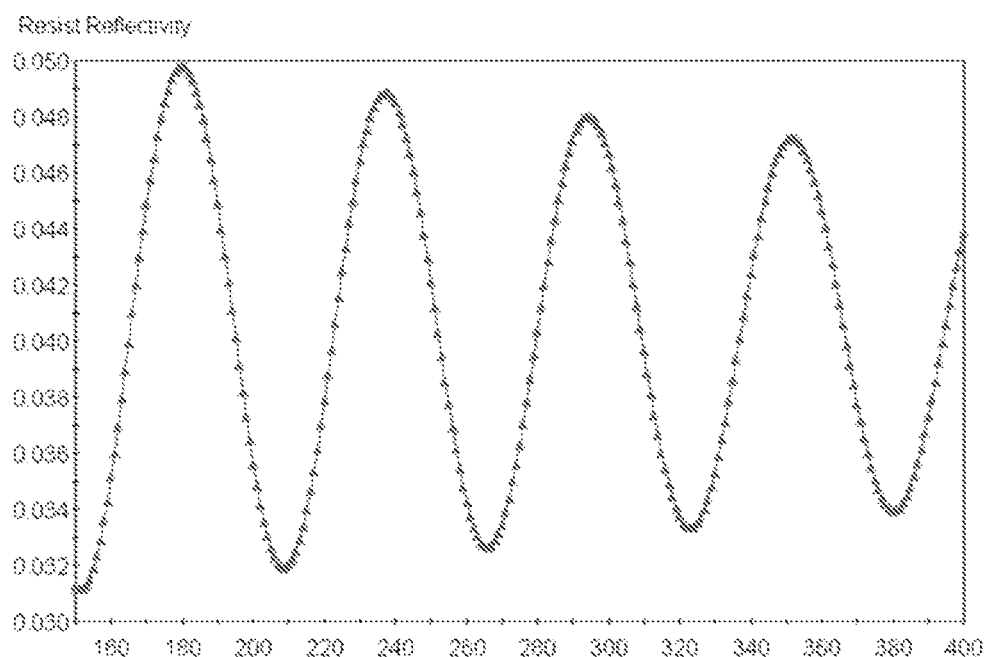
FIG. 14 is a graph illustrating reflectivity swing curve using a mask structure that only includes a spun on hard mask layer.

To further point out the advantages of the bi-layer mask structure 602, 702, FIG. 13 shows the reflectivity swing for various photoresist thicknesses when only the second hard mask material (e.g. $SiO_2$) is used in the hard mask structure. As can be seen the reflectivity has an amplitude of up to 0.10. FIG. 14, on the other hand shows the reflectivity swing for a mask wherein only the spun on hard mask (such as hard mask 602) is used in the mask structure. As can be seen, the amplitude of the reflectivity is cut in half to 0.050. However, as discussed above, this comes at the cost of hard mask selectivity.

Figure 15:
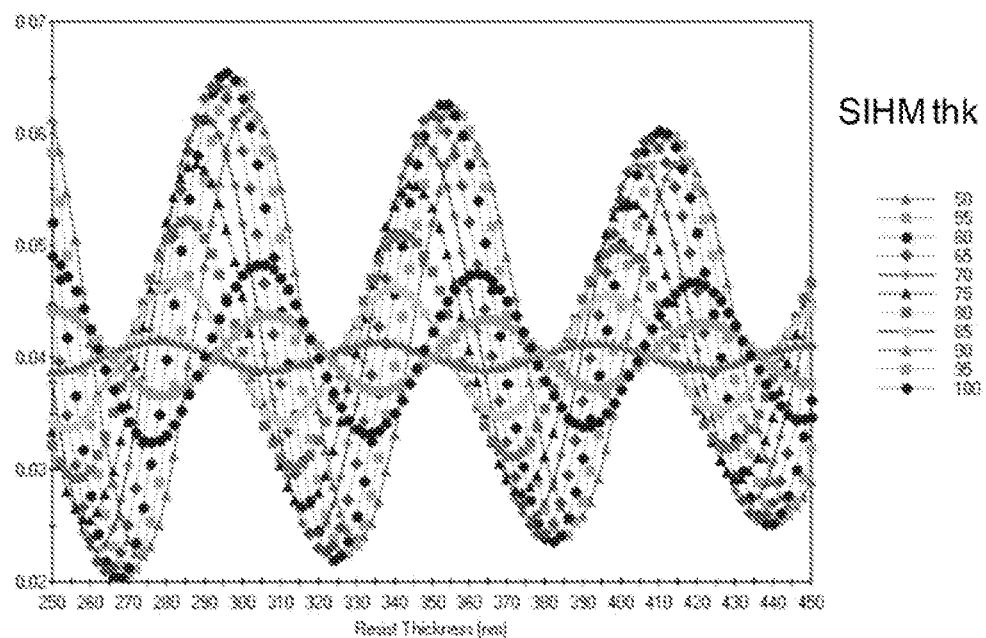
FIG. 15 is a graph illustrating reflectivity swing curve using a novel bi-layer hard mask structure.

FIG. 15 shows the reflectivity swing using a bi-layer hard mask structure such as that described above. It can be seen that the amplitude of the reflectivity can be even lower than that of FIG. 14 by carefully matching bi-layer hardmask and resist thickness, and is much less than that of FIG. 13. However, as discussed above, this mask structure also provides the necessary RIE selectivity for good mask patterning. Another advantage of such bi-layer or multi-layer hardmask is that the same RIE chemistry can be used to transfer the resist pattern into that hard mask without additional RIE process steps. The sputter deposited hard mask also improves hard mask thickness mean and uniformity control, which is key to the success of tri-layer image process, as spin on hard mask material thickness and uniformity control tends to be affected by incoming substrate surface condition like topography variation from either process features or contamination particles. The better etch resistance of the second hard mask layer also enables the reduction of total hardmask thickness, and would help to achieve better final profile control in the tri-layer image transfer process.

It should be pointed out that, while the above described process has been described in terms of patterning a magnetic write pole for use in a magnetic data recording apparatus, this is by way of example and presents a useful application of the above described process. The above described process using a multilayer hard mask structure could, however, be used to pattern a metallic layer generally and as such would be useful in the construction of various other devices.

While various embodiments have been described, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their-equivalents.

What is claimed is:

1. A method for patterning a metallic layer, comprising:
providing a substrate;
depositing a metallic material over the substrate;
forming a mask structure over the metallic material, the mask structure including:
an image transfer layer formed of a soluble polyimide formed over the metallic material;
a first hard mask that is deposited by spin on deposition over the image transfer layer, the first hard mask being a Si containing bottom anti-reflective coating material; and
a second hard mask layer formed over the first hard mask layer and formed of a sputter deposited material, the second hard mask comprising one or more of $SiO_2$, $SiO_xN_y$, Six, TaO, $TaO_5$ and SiC; and
performing an ion milling to remove portions of the metallic material that are not protected by the mask structure.

2. The method as in claim 1 wherein the first hard mask layer comprises a Si containing mask layer designed for spin on application.

3. The method as in claim 1 wherein the metallic layer is a magnetic write pole material and the ion milling defines a magnetic write pole for use in a magnetic data recording apparatus.

4. The method as in claim 1 wherein the second hard mask layer is thicker than the first hard mask layer.

5. The method as in claim 1 wherein the first hard mask layer has a thickness of 20-300 inn and the second hard mask layer has a thickness of 2 to 300 nm.

6. A method for manufacturing a magnetic pole, comprising:
providing a substrate;
depositing a metallic material over the substrate;
depositing an image transfer layer formed of a soluble polyimide material over the magnetic material;
depositing a first hard mask layer over the image transfer layer, the first hard mask layer being a Si containing a bottom antireflective coating;
depositing a second hard mask layer over the first hard mask layer, the second hard mask layer comprising one or more of $SiO_2$, $SiO_xN_y$, SiN, TaO $Ta_2O_5$ and SiC;
depositing a photoresist layer over the second hard mask layer;
photolithographically patterning the photoresist layer to form a photoresist mask;
performing a first reactive ion etching to transfer the image of the photoresist mask onto the underlying first and second hard mask layers;
performing a second reactive ion etching to transfer the image of the first and second hard mask layers onto the underlying image transfer layer; and
performing an ion milling to remove portions of the metallic material that are not protected by the image transfer layer.

7. The method as in claim 6 wherein the first hard mask layer is a material that is applied by a spin on coating method and the second hard mask layer is deposited by sputter deposition.

8. The method as in claim 6 wherein the metallic layer is a magnetic write pole material and the ion milling defines a magnetic write pole for use in a magnetic data recording apparatus.

9. The method as in claim 6 wherein the first hard mask layer comprises a UVAS.

10. The method as in claim 6 wherein the first reactive ion etching is performed in a fluorine chemistry and the second reactive ion etching is performed in an oxygen chemistry.

11. The method as in claim 6 wherein the first reactive ion etching is performed in a fluorine chemistry and the second reactive ion etching is performed in an oxygen chemistry.

* * * * *